US012701733B2

(12) United States Patent
Yoshimoto et al.

(10) Patent No.: US 12,701,733 B2
(45) Date of Patent: Aug. 4, 2026

(54) METHOD OF MANUFACTURING SILICON CARBIDE SEMICONDUCTOR DEVICE

(71) Applicant: FUJI ELECTRIC CO., LTD.,
Kawasaki (JP)

(72) Inventors: Atsushi Yoshimoto, Matsumoto City
(JP); Hidenori Satou, Matsumoto City
(JP); Takahito Kojima, Matsumoto
City (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 360 days.

(21) Appl. No.: 18/587,742

(22) Filed: Feb. 26, 2024

(65) Prior Publication Data

US 2024/0339323 A1      Oct. 10, 2024

(30) Foreign Application Priority Data

Apr. 6, 2023     (JP) ................................. 2023-062418

(51) Int. Cl.
H10D 30/01          (2025.01)
H10D 12/01          (2025.01)
                (Continued)
(52) U.S. Cl.
CPC ....... H10D 30/0297 (2025.01); H10D 12/031
(2025.01); H10D 30/668 (2025.01);
(Continued)
(58) Field of Classification Search
CPC ............. H10D 12/031; H10D 30/0297; H10D
30/668; H10D 62/107; H10D 62/109;
(Continued)

(56) References Cited

U.S. PATENT DOCUMENTS

2013/0248932 A1      9/2013   Tomabechi
2017/0140934 A1      5/2017   Hamada et al.
2020/0006046 A1*     1/2020   Nagasawa ............. H10P 10/128

FOREIGN PATENT DOCUMENTS

JP          2013-201397 A      10/2013
JP              5550738 B2      7/2014
            (Continued)

*Primary Examiner* — Sue A Purvis
*Assistant Examiner* — Kevin Quinto
(74) *Attorney, Agent, or Firm* — Rabin.& Berdo. P.C

(57)          ABSTRACT

A method of manufacturing a silicon carbide semiconductor device, includes preparing a silicon carbide semiconductor substrate in which a first semiconductor layer of a first conductivity type is provided on a starting substrate of the first conductivity type; ion-implanting first semiconductor regions of a second conductivity type in the first semiconductor layer; thereafter, forming, at a C-face, an oxide film thicker than that at a Si-face as a treatment of reversing warpage of the silicon carbide semiconductor substrate. The method further includes ion-implanting a second semiconductor layer of the second conductivity type in the first semiconductor layer and a third semiconductor layer of the first conductivity type in a surface layer of the second semiconductor layer; activating the first semiconductor regions and the second and third semiconductor layers; and forming trenches reaching the first semiconductor layer at positions facing the first semiconductor regions in a depth direction.

6 Claims, 7 Drawing Sheets

(51) Int. Cl.

| | |
|---|---|
| *H10D 30/66* | (2025.01) |
| *H10D 62/10* | (2025.01) |
| *H10D 62/832* | (2025.01) |
| *H10P 30/20* | (2026.01) |
| *H10P 50/00* | (2026.01) |

(52) U.S. Cl.
CPC ....... *H10D 62/109* (2025.01); *H10D 62/8325* (2025.01); *H10P 30/2042* (2026.01); *H10P 30/21* (2026.01); *H10P 50/00* (2026.01)

(58) Field of Classification Search
CPC .............. H10D 62/157; H10D 62/393; H10D 62/8325; H10P 30/2042; H10P 30/21; H10P 50/00
See application file for complete search history.

(56) References Cited

FOREIGN PATENT DOCUMENTS

| | | | |
|---|---|---|---|
| JP | 6272488 | B2 | 1/2018 |
| JP | 2022-162283 | A | 10/2022 |

* cited by examiner

FIG.2

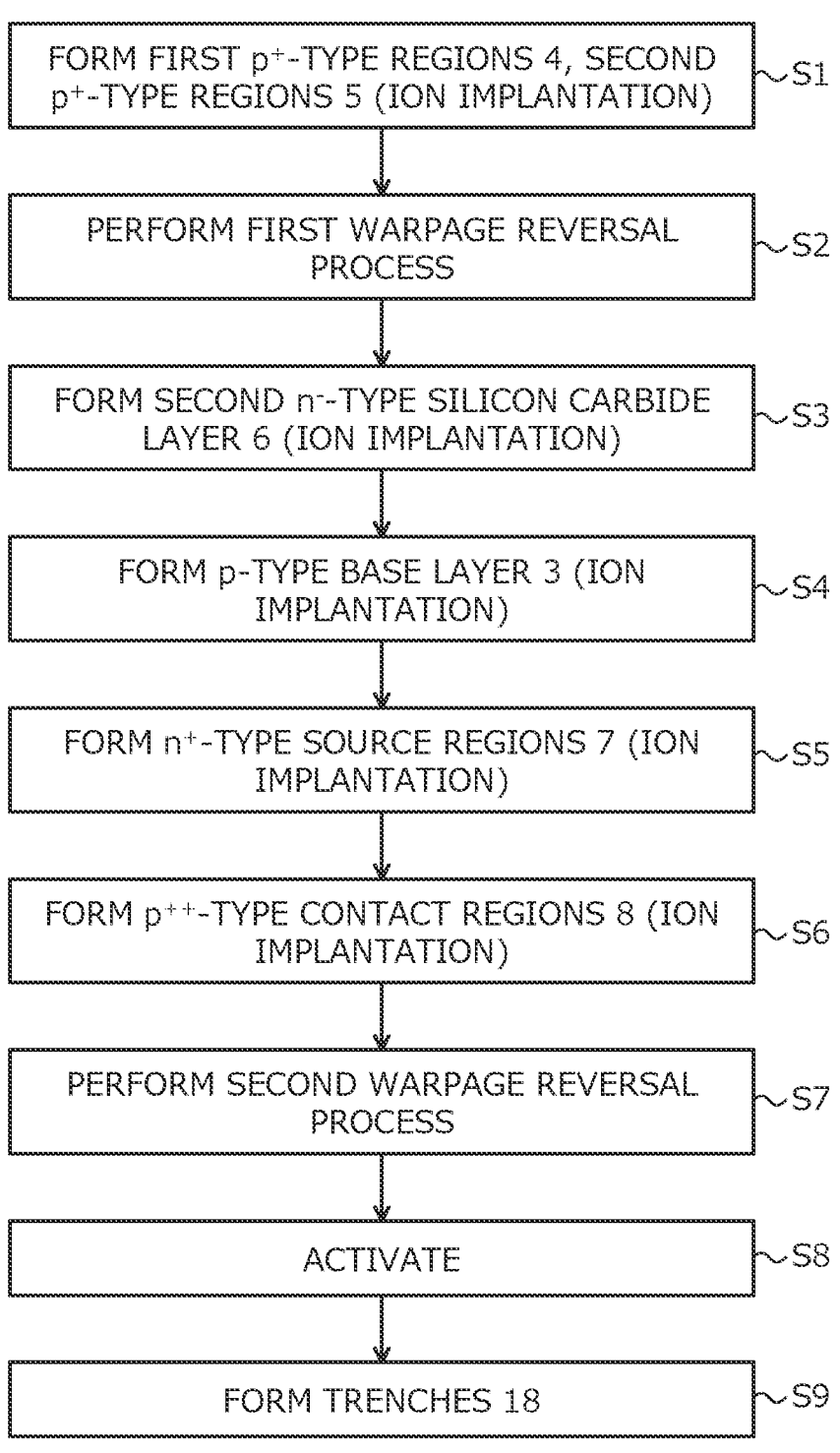

FORM FIRST p$^+$-TYPE REGIONS 4, SECOND p$^+$-TYPE REGIONS 5 (ION IMPLANTATION) ～S1

PERFORM FIRST WARPAGE REVERSAL PROCESS ～S2

FORM SECOND n$^-$-TYPE SILICON CARBIDE LAYER 6 (ION IMPLANTATION) ～S3

FORM p-TYPE BASE LAYER 3 (ION IMPLANTATION) ～S4

FORM n$^+$-TYPE SOURCE REGIONS 7 (ION IMPLANTATION) ～S5

FORM p$^{++}$-TYPE CONTACT REGIONS 8 (ION IMPLANTATION) ～S6

PERFORM SECOND WARPAGE REVERSAL PROCESS ～S7

ACTIVATE ～S8

FORM TRENCHES 18 ～S9

FIG.9

METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2023-062418, filed on Apr. 6, 2023, the entire contents of which are incorporated herein by reference.

BACKGROUND OF THE INVENTION

1. Field of the Invention

Embodiments of the invention relate to a method of manufacturing a silicon carbide semiconductor device.

2. Description of the Related Art

According an existing method of manufacturing a silicon carbide semiconductor (SiC) device, warpage of a wafer occurs due to a process for forming electrodes and the amount of warpage is decreased to a level (value) that does not affect manufacturing processes (refer to Japanese Patent No. 5550738). Another existing method of manufacturing a silicon carbide semiconductor device includes a process of forming an ion implanted region that controls warpage of a SiC epitaxial substrate (refer to Japanese Patent No. 6272488).

SUMMARY OF THE INVENTION

According to an embodiment of the invention, a method of manufacturing a silicon carbide semiconductor device, the method includes: preparing a silicon carbide semiconductor substrate in which a first semiconductor layer of a first conductivity type is provided on a first surface of a starting substrate of the first conductivity type, the first surface of the starting substrate being opposite to a second surface of the starting substrate, the first semiconductor layer having an impurity concentration lower than an impurity concentration of the starting substrate; forming a plurality of first semiconductor regions of a second conductivity type in the first semiconductor layer by ion implantation; performing a first treatment of reversing warpage of the silicon carbide semiconductor substrate after forming the plurality of first semiconductor regions; forming a second semiconductor layer of the second conductivity type in the first semiconductor layer by ion implantation; forming a third semiconductor layer of the first conductivity type in a surface layer of the second semiconductor layer by ion implantation; activating the plurality of first semiconductor regions, the second semiconductor layer, and the third semiconductor layer; forming a plurality of trenches penetrating through the third semiconductor layer and the second semiconductor layer and reaching the first semiconductor layer, each of the plurality of trenches being formed at a position facing a corresponding one of the plurality of first semiconductor regions in a depth direction of the device; forming a plurality of gate electrodes in the plurality of trenches via a plurality of gate insulating films; forming a first electrode in contact with the third semiconductor layer and the second semiconductor layer; and forming a second electrode at the second surface of the starting substrate. The first treatment of reversing the warpage includes forming, at a C-face of the silicon carbide semiconductor substrate, a first oxide film that is thicker than a second oxide film formed at a Si-face of the silicon carbide semiconductor substrate.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a flowchart depicting an outline of a method of manufacturing the silicon carbide semiconductor device according to the embodiment.

FIG. 9 is a cross-sectional view schematically depicting a state during manufacture of the silicon carbide semiconductor device according to the embodiment.

DETAILED DESCRIPTION OF THE INVENTION

Figure 1:
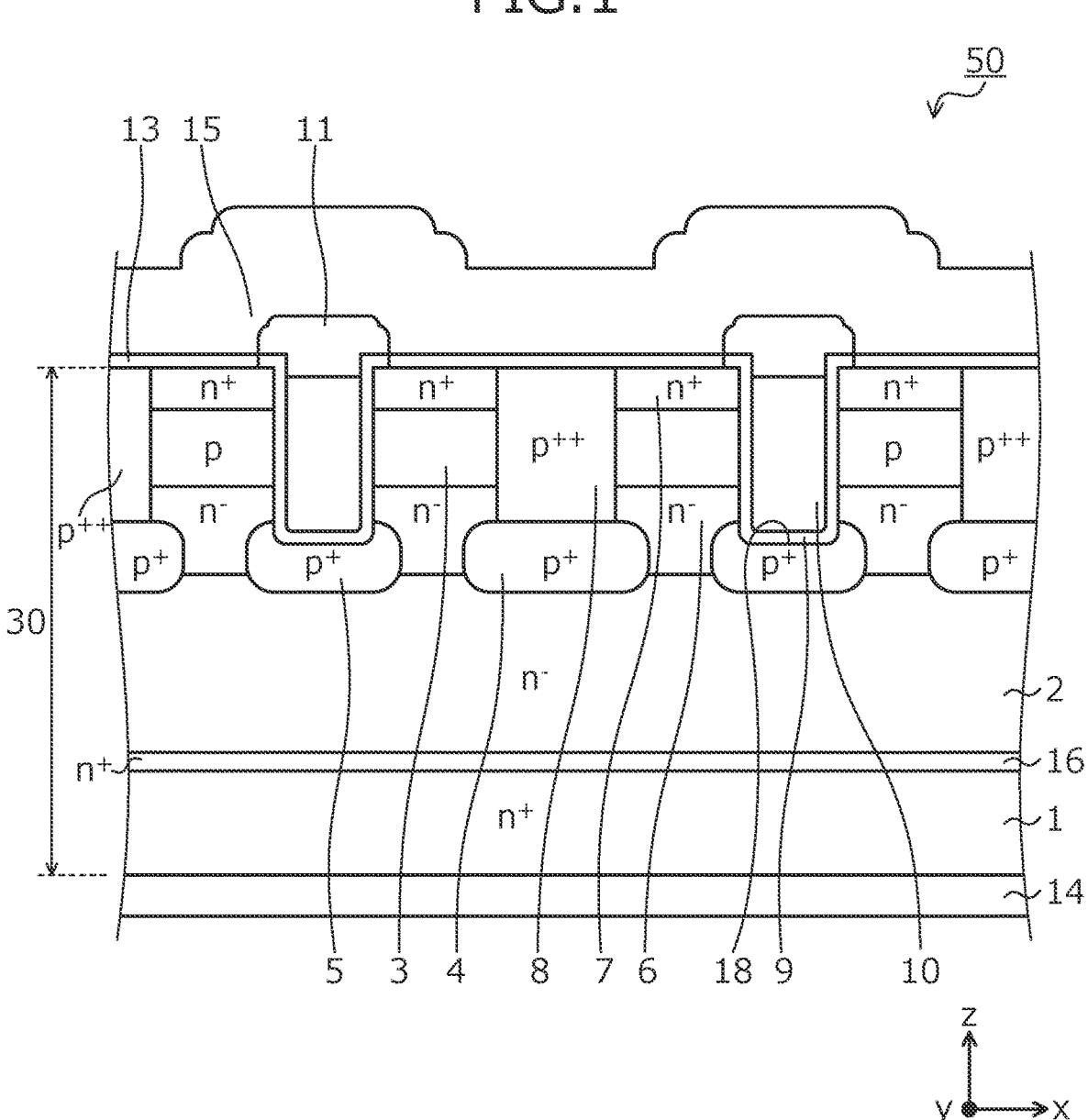
FIG. 1 is a cross-sectional view depicting a structure of a silicon carbide semiconductor device according to an embodiment.

First, problems associated with the conventional techniques are discussed. Conventionally, in an instance in which a doped layer is formed by only ion implantation, a problem arises in that warpage of the substrate causes patterning defects, stage chuck failures and conveyance failures inside the manufacturing equipment.

Embodiments of a method of manufacturing a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

First, a method of manufacturing a conventional semiconductor device is described. Conventionally, a trench-type MOSFET has, for example, doped layers formed as follows. First, at a front surface of an $n^+$-type starting substrate, an $n^+$-type buffer layer and an n-type silicon carbide epitaxial layer are deposited. Next, an n-type high-concentration region is formed by ion-implantation of an n-type impurity. Next, first $p^+$-type base regions and second $p^+$-type base regions are formed by ion-implantation of a p-type impurity. Next, an n-type silicon carbide layer is epitaxially grown. Next, p-type base regions are formed by ion-implantation of a p-type impurity. Next, $n^+$-type source regions are formed by ion-implantation of an n-type impurity. Next, by ion-implantation of a p-type impurity, $p^{++}$-type contact regions are formed. Thereafter, an activation treatment is performed; and trenches are formed. As described, ion implantation and epitaxial growth are combined to thereby form doped layers.

Nonetheless, the epitaxial growth generates substrate defects and thus, characteristics of the semiconductor device degrade. Further, epitaxial growth equipment requires process control and incurs cost for equipment maintenance. Thus, development is advancing for silicon carbide semiconductor devices in which doped layers are formed only by ion implantation including a combination of ion implantation by a normal energy (up to 900 KeV) and high-acceleration ion implantation (acceleration of 1 MeV or greater) capable of implanting the impurity to a deeper location, without performing epitaxial growth.

In the manufacture of a semiconductor device, when a doped layer is formed by ion implantation, a problem of warpage of the semiconductor substrate arises. In silicon carbide semiconductor devices with extremely small diffusion coefficients for impurities, ion implantation is performed with high acceleration and high concentration, which has a particularly large impact, whereby warpage of several hundred μm or greater may occur. Conventionally, semiconductor devices are manufactured by combining ion implantation and epitaxial growth and thus, the direction of warpage differs for each, thereby canceling each other and thus, keeping the warpage to about several tens of μm. On the other hand, when a doped layer is formed by only ion implantation, warpage of the substrate is not mitigated. In this instance, problems such as patterning defects, stage chuck failures and conveyance failures inside the manufacturing equipment occur.

Herein, a method of manufacturing a semiconductor device according to an embodiment addressing the problems above is described. A semiconductor device according to the present invention contains a wide band gap semiconductor. In the embodiment, a silicon carbide semiconductor device that is manufactured (fabricated) using for example, silicon carbide (SiC) as a wide band gap semiconductor is described taking a trench-type MOSFET 50 as an example. FIG. 1 is a cross-sectional view depicting a structure of a silicon carbide semiconductor device according to the embodiment. FIG. 1 depicts only an active region through which a main current of the trench-type MOSFET 50 flows.

As depicted in FIG. 1, in the silicon carbide semiconductor device according to the embodiment, an $n^+$-type buffer layer 16 and a first $n^-$-type silicon carbide epitaxial layer 2 are stacked on a first main surface (front surface), for example, a (0001) plane (Si-face) of an $n^+$-type starting substrate 1.

The $n^+$-type starting substrate 1, for example, is a silicon carbide single crystal substrate doped with nitrogen (N). The $n^+$-type buffer layer 16, for example, is a highly doped layer having a thickness in a range of 1 μm to 5 μm and doped with a high concentration of nitrogen in a range of $1 \times 10^{17}$/cm$^3$ to $1 \times 10^{18}$/cm$^3$. The $n^+$-type buffer layer 16 promotes recombination of holes from the first $n^-$-type silicon carbide epitaxial layer 2, controls the concentration of the holes reaching the $n^+$-type starting substrate 1, and suppresses the generation of stacking faults and any increases in the area thereof.

The first $n^-$-type silicon carbide epitaxial layer 2 is a low-concentration $n^-$-type drift layer doped with, for example, nitrogen and has an impurity concentration lower than an impurity concentration of the $n^+$-type starting substrate 1. At a first surface of the first $n^-$-type silicon carbide epitaxial layer 2, opposite to a second surface thereof facing the $n^+$-type starting substrate 1, a second $n^-$-type silicon carbide layer 6 is formed. The second $n^-$-type silicon carbide layer 6 is a high-concentration n-type drift layer doped with, for example, nitrogen and has an impurity concentration lower than the impurity concentration of the $n^+$-type starting substrate 1 but higher than the impurity concentration of the first $n^-$-type silicon carbide epitaxial layer 2. Hereinafter, the $n^+$-type starting substrate 1, the first $n^-$-type silicon carbide epitaxial layer 2, the second $n^-$-type silicon carbide layer 6, and a later-described p-type base layer 3 combined constitute a silicon carbide semiconductor substrate.

At a second main surface (back surface, i.e., a back surface (C-face) of the silicon carbide semiconductor substrate) of the $n^+$-type starting substrate 1, a back electrode (drain electrode) is provided. The back electrode constitutes the drain electrode. On a surface of the back electrode, a drain electrode pad 14 is provided.

In the silicon carbide semiconductor substrate, in a first side thereof (side having the p-type base layer 3), a trench structure is formed. In particular, trenches 18 penetrate through the p-type base layer 3 from a first surface of the p-type base layer 3, opposite to a second surface thereof facing the $n^+$-type starting substrate, and reach the second $n^-$-type silicon carbide layer 6. Along inner walls of the trenches 18, gate insulating films 9 are formed on bottoms and sidewalls of the trenches 18; and on the gate insulating films 9 in the trenches 18, gate electrodes 10 are formed. The gate electrodes 10 are insulated from the first $n^-$-type silicon carbide epitaxial layer 2, the second $n^-$-type silicon carbide layer 6, and the p-type base layer 3 by the gate insulating films 9. A portion of each of the gate electrodes 10 may protrude from a top (side facing a source electrode pad 15) the trenches 18 in a direction toward the source electrode pad 15.

In the first $n^-$-type silicon carbide epitaxial layer 2 and the second $n^-$-type silicon carbide layer 6, first $p^+$-type regions 4 and second $p^+$-type regions 5 are selectively provided. The first $p^+$-type regions 4 extend to deep positions closer to the drain electrode pad 14 than are the bottoms of the trenches 18. Bottoms ends (ends facing the drain electrode pad 14) of the first $p^+$-type regions 4 are positioned closer to the drain electrode pad 14 than are the bottoms of the trenches 18. The first $p^+$-type regions 4 are provided between the trenches 18. As depicted in FIG. 1, while the first $p^+$-type regions 4 are in contact with later-described $p^{++}$-type contact regions 8, configuration may be such that the first $p^+$-type regions 4 are apart from the $p^{++}$-type contact regions 8. In this instance, upper surfaces of the first $p^+$-type regions 4 are provided in a surface layer of the second $n^-$-type silicon carbide layer 6 and is in contact with a lower surface of the p-type base layer 3.

Lower ends of the second $p^+$-type regions 5 are positioned closer to the drain electrode pad 14 than are the bottoms of the trenches 18. The second $p^+$-type regions 5 are formed at positions facing the bottoms of the trenches 18 in a depth direction z. A width of each of the second p$^+$-type regions 5 is wider than a width of each of the trenches 18. The bottoms of the trenches 18 may extend to the second p$^+$-type regions 5; may be in the second n$^-$-type silicon carbide layer 6, positioned between the p-type base layer 3 and the second p$^+$-type regions 5; or may be apart from the second p$^+$-type regions 5. Upper surfaces of the second p$^+$-type regions 5 may be closer to the drain electrode pad 14 than are the bottoms of the trenches 18 or closer (or partially closer) to the source electrode pad 15. The first p$^+$-type regions 4 and the second p$^+$-type regions 5, for example, are doped with aluminum (Al).

Each of the first p$^+$-type regions 4 may have portions that extend toward the trenches 18 so as to be connected to the second p$^+$-type regions 5. In this instance, in a layout in a plan view of the device, the extended portions of the first p$^+$-type regions 4 may repeatedly alternate with the second n$^-$-type silicon carbide layer 6 in a direction (hereinafter, second direction) y orthogonal to a direction (hereinafter, first direction) x in which the first p$^+$-type regions 4 and the second p$^+$-type regions 5 are arranged. In other words, the extended portions of the first p$^+$-type regions 4 and the second p$^+$-type regions 5 are connected to one another at least at one location in the second direction y. As a result, holes that are generated during avalanche breakdown, at portions where the second p$^+$-type regions 5 and the first n$^-$-type silicon carbide epitaxial layer 2 are connected may be efficiently migrated to source electrodes 13, thereby reducing the load on the gate insulating films 9, whereby reliability is enhanced.

In the first n$^-$-type silicon carbide epitaxial layer 2, at a surface thereof facing the source electrode pad 15, the p-type base layer 3 is provided. The p-type base layer 3 has an impurity concentration that may be, for example, lower than an impurity concentration of the first p$^+$-type regions 4. As a result, even when the concentration of the p-type base layer 3 is lowered to reduce a threshold voltage, spreading of a depletion layer of the p-type base layer 3 is suppressed, whereby drops in breakdown voltage due to punch-through may be avoided. In the p-type base layer 3, at the surface thereof facing the source electrode pad 15, n$^+$-type source regions 7 and the p$^{++}$-type contact regions 8 are selectively formed. Further, the n$^+$-type source regions 7 and the p$^{++}$-type contact regions 8 are in contact with one another.

In FIG. 1, while only two trench MOS structures are depicted, further trench MOS gate (insulated gate containing metal-oxide-semiconductor) structures may be disposed in parallel.

An insulating film 11 is provided in an entire area of the first main surface of the silicon carbide semiconductor substrate, so as to cover the gate electrodes 10 embedded in the trenches 18. The source electrodes 13 are in contact with the n$^+$-type source regions 7 and the p$^{++}$-type contact regions 8 via contact holes of the insulating film 11. The source electrodes 13 are electrically insulated from the gate electrodes 10 by the insulating film 11. The source electrode pad 15 is provided on the source electrodes 13.

Next, the method of manufacturing the silicon carbide semiconductor device according to the embodiment is described. FIG. 2 is a flowchart depicting an outline of the method of manufacturing the silicon carbide semiconductor device according to the embodiment. FIGS. 3, 4, 5, 6, 7, 8, and 9 are cross-sectional views schematically depicting states during manufacture of the silicon carbide semiconductor device according to the embodiment.

Figure 3:
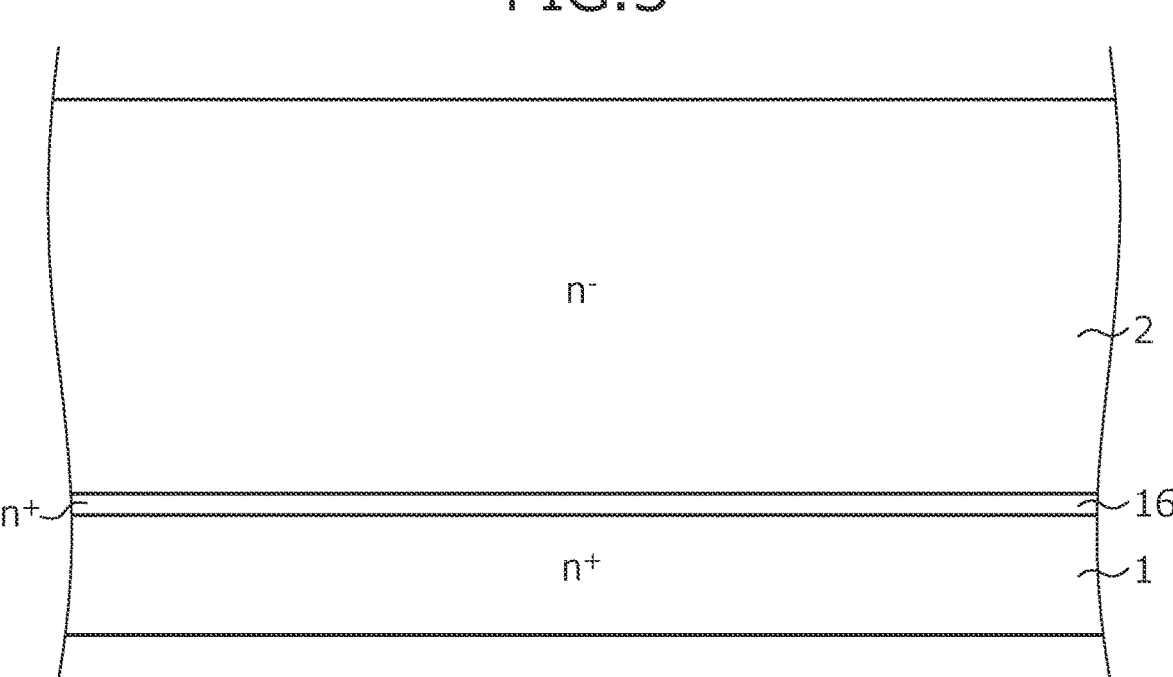
FIG. 3 is a cross-sectional view schematically depicting a state during manufacture of the silicon carbide semiconductor device according to the embodiment.

First, as depicted in FIG. 3, a silicon carbide semiconductor substrate 30 in which the first n$^-$-type silicon carbide epitaxial layer (first semiconductor layer of the first conductivity type) 2 and the n$^+$-type buffer layer 16 are deposited on the n$^+$-type starting substrate (starting substrate of a first conductivity type) 1 containing an n-type silicon carbide is prepared (first process). Here, a diameter of the n$^+$-type starting substrate used is 150 mm. The silicon carbide semiconductor substrate 30, or only the n$^+$-type starting substrate 1 may be purchased and the n$^+$-type buffer layer 16 and the first n$^-$-type silicon carbide epitaxial layer 2 may be formed thereon by epitaxial growth to thereby form the silicon carbide semiconductor substrate 30. In this instance, on the first main surface of the n$^+$-type starting substrate 1, the n$^+$-type buffer layer 16 containing silicon carbide is epitaxially grown while an n-type impurity, for example, nitrogen atoms (N), is doped. Next, on the n$^+$-type buffer layer 16, the first n$^-$-type silicon carbide epitaxial layer 2 containing silicon carbide is grown while an n-type impurity, for example, nitrogen atoms, is doped.

Figure 4:
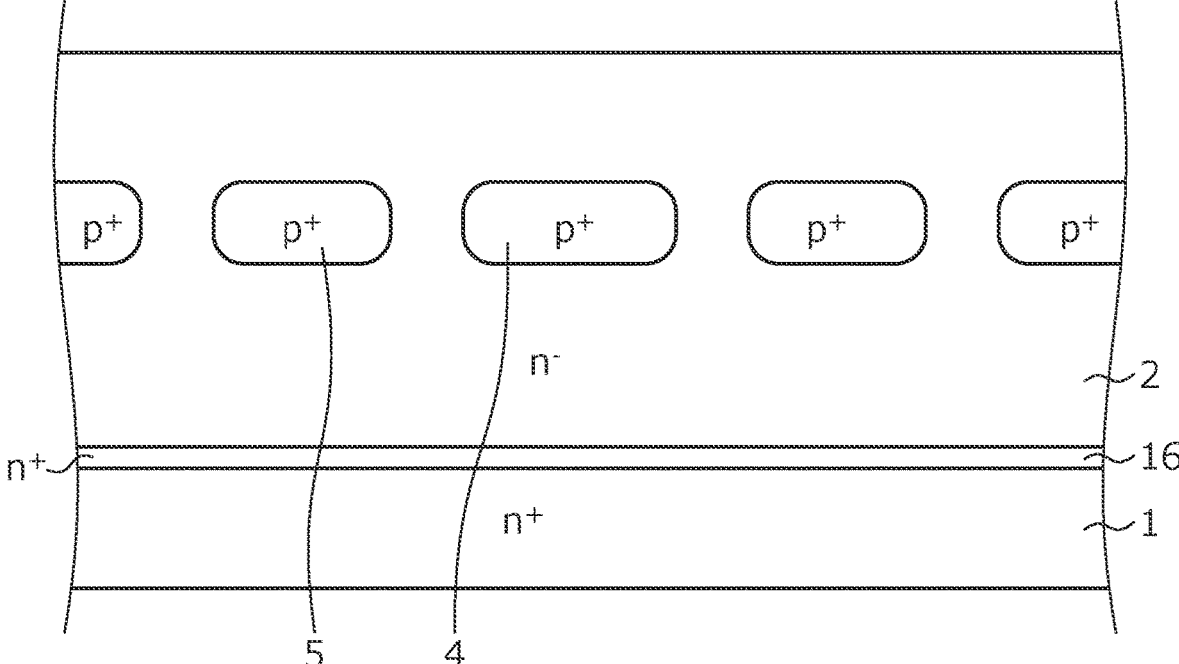
FIG. 4 is a cross-sectional view schematically depicting a state during manufacture of the silicon carbide semiconductor device according to the embodiment.

Next, on the surface of the first n$^-$-type silicon carbide epitaxial layer 2, by a photolithographic technique, a non-depicted resist mask having predetermined openings is formed. Subsequently, as depicted in FIG. 4, a p-type impurity, for example, aluminum atoms are ion-implanted, whereby in the first n$^-$-type silicon carbide epitaxial layer 2, at a depth of about 0.6 μm, the first p$^+$-type regions (second semiconductor regions of a second conductivity type) 4 and the second p$^+$-type regions (first semiconductor regions of the second conductivity type) 5 are formed having an impurity concentration of, for example, $3\times10^{18}$/cm$^3$ (step S1: second process). Next, the resist mask for the ion implantation is removed.

Next, a first warpage reversal process for reversing warpage of the silicon carbide semiconductor substrate 30 is performed (step S2: third process). Due to the ion implantation at step S1, warpage in a convex chevron-shape, for example, warpage of about 150 μm is generated at the front surface of the silicon carbide semiconductor substrate 30. The first p$^+$-type regions 4 and the second p$^+$-type regions 5 are formed in deep regions and thus, high-acceleration (1 MeV or greater) ion implantation is performed. As a result, in the silicon carbide semiconductor substrate 30, the chevron-shaped warpage is significant and the warpage reversal process to reduce the warpage of the silicon carbide semiconductor substrate 30 has to be performed. In the warpage reversal process, for example, the extent (amount) of wafer warpage of the silicon carbide semiconductor substrate 30 is reduced to be less than 100 μm. The amount of wafer warpage is the difference of a tallest portion and a lowest portion of the silicon carbide semiconductor substrate 30.

Figure 10:
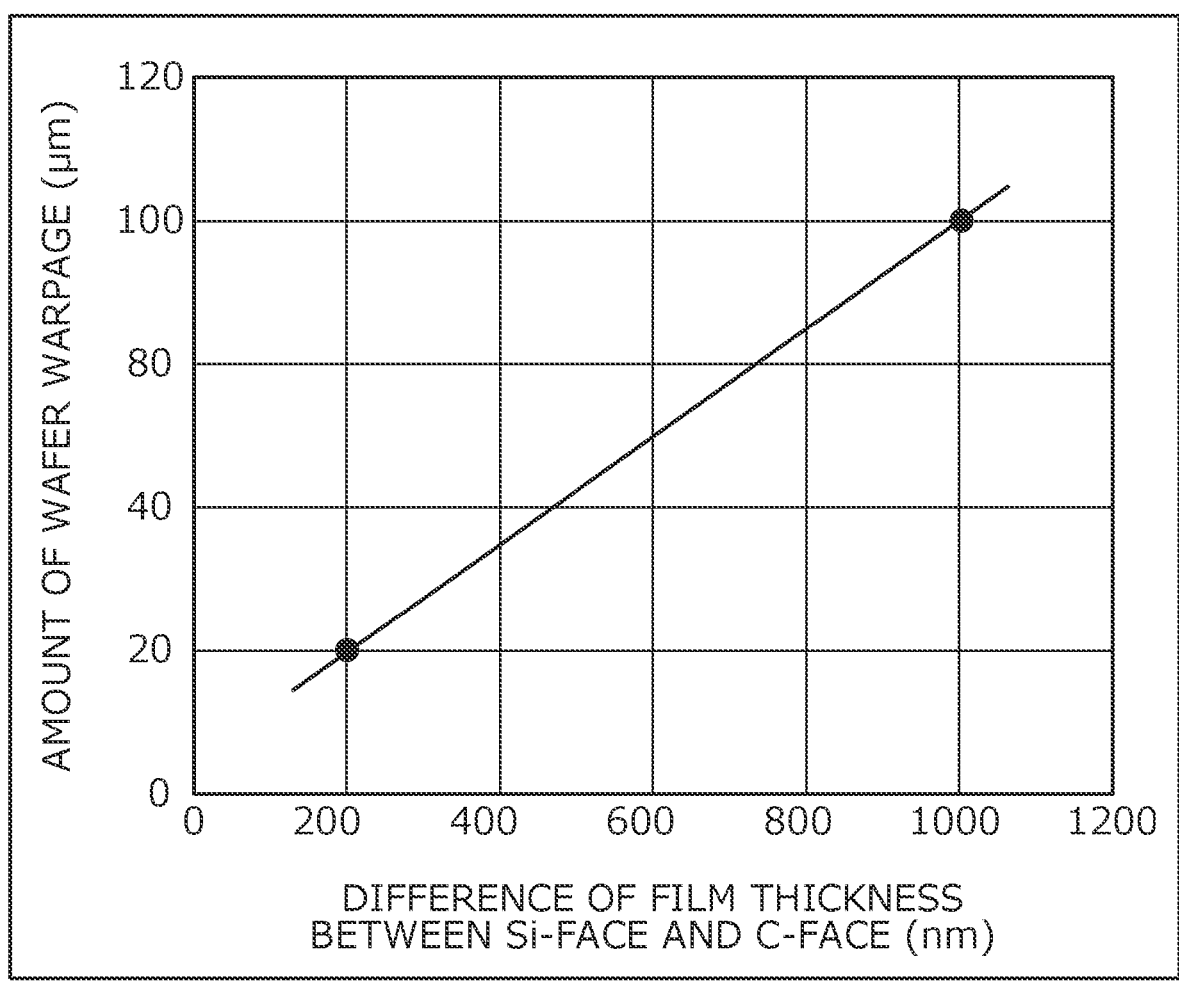
FIG. 10 is a graph showing a relationship between the amount of wafer warpage and a difference of oxide film thickness of a Si-face and a C-face.

FIG. 10 is a graph showing a relationship between the amount of wafer warpage and a difference of oxide film thickness of the Si-face and the C-face. In FIG. 10, a vertical axis indicates the amount of wafer warpage in units of μm. A horizontal axis indicates the difference of oxide film thickness of the Si-face and the C-face in units of nm. The front surface of the silicon carbide semiconductor substrate 30 is an Si-face while the back surface thereof is a C-face and of the Si-face and the C-face, the C-face oxidizes more easily. Therefore, when the silicon carbide semiconductor substrate 30 is oxidized, a difference in the rate of growth of the oxide film at the Si-face and at the C-face occurs and as a result, oxidation at the C-face is thicker than that at the Si, whereby a difference in oxide film thickness occurs.

According to FIG. 10, wafer warpage is generated due to the difference in the thicknesses of the oxide film (second oxide film) at the Si-face and the oxide film (first oxide film) at the C-face. Oxidation at the C-face surface of the silicon carbide semiconductor substrate 30 is relatively thicker and thus, concave-shaped warpage is generated at the front surface. As described, due to the difference of the thicknesses of the oxide films at the Si-face and the C-face, warpage of the silicon carbide semiconductor substrate 30 is generated that is in a direction opposite to that of the warpage caused by the ion implantation and thus, the warpage of the silicon carbide semiconductor substrate 30 may be reversed.

Thus, in the embodiment, in the first warpage reversal process, the silicon carbide semiconductor substrate 30 is oxidized so that the difference in the thicknesses of the oxide films is in a range of 200 nm 1000 nm. According to FIG. 10, the amount of wafer warpage is in a range of 20 $\mu$m to 100 $\mu$m; the warpage of the silicon carbide semiconductor substrate 30 caused by the ion implantation is reduced; and the amount of warpage of the silicon carbide semiconductor substrate 30 may be reduced to be less than 100 $\mu$m. For example, when the difference in the thicknesses of the oxide films is about 600 nm, according to FIG. 10, concave-shaped warpage of about 60 $\mu$m is generated at the front surface. Thus, the convex chevron-shaped warpage of 150 $\mu$m at the front surface formed by the ion implantation is reduced to 90 $\mu$m (150-60) and thus, the amount of warpage of the silicon carbide semiconductor substrate 30 becomes less than 100 $\mu$m. Further, removal of the oxide films formed here is unnecessary.

Further, while the oxidation may be dry ($O_2$) oxidation or pyrogenic ($H_2O$) oxidation, the difference in the rate of oxidation is greater for pyrogenic oxidation than for dry oxidation, the difference in the thicknesses of the oxide films may be made greater for pyrogenic oxidation, and the amount of wafer warpage may be increased. Further, while the difference in the rates of oxidation is smaller for higher oxidation temperatures, oxidation does not advance at a temperature of 1000 degrees C. or less and thus, the temperature of oxidation has to be 1000 degrees C.

At step S1, while formation of the second $p^+$-type regions 5 that protect the bottoms of the trenches 18 is necessary, configuration may be such that the first $p^+$-type regions 4 between the trenches 18 are omitted. In this instance, after the second $p^+$-type regions 5 are formed, the first warpage reversal process at step S2 is performed.

Figure 5:
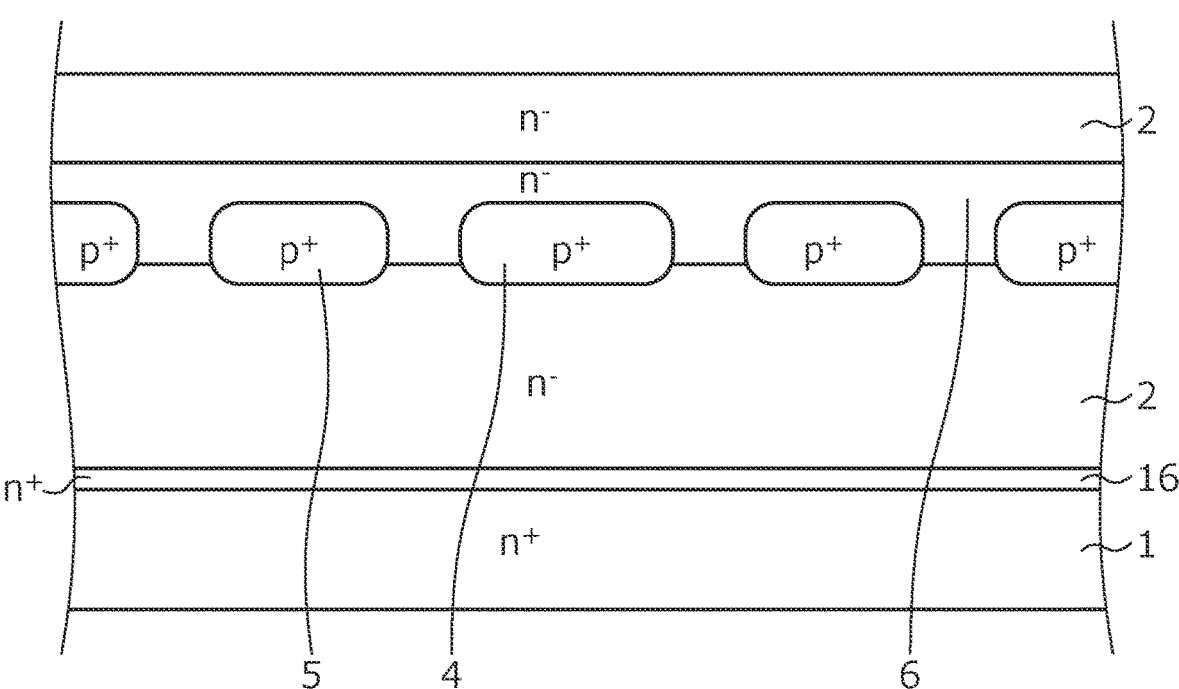
FIG. 5 is a cross-sectional view schematically depicting a state during manufacture of the silicon carbide semiconductor device according to the embodiment.

Next, on the surface of the first $n^-$-type silicon carbide epitaxial layer 2, a non-depicted resist mask having predetermined openings is formed by a photolithographic technique. Subsequently, as depicted in FIG. 5, the second $n^-$-type silicon carbide layer 6 having a thickness of about 0.7 $\mu$m and doped with an n-type impurity such as nitrogen is formed by ion implantation and has an impurity concentration of, for example, $2\times10^{17}$/cm$^3$ (step S3). Next, the resist mask for the ion implantation is removed.

Figure 6:
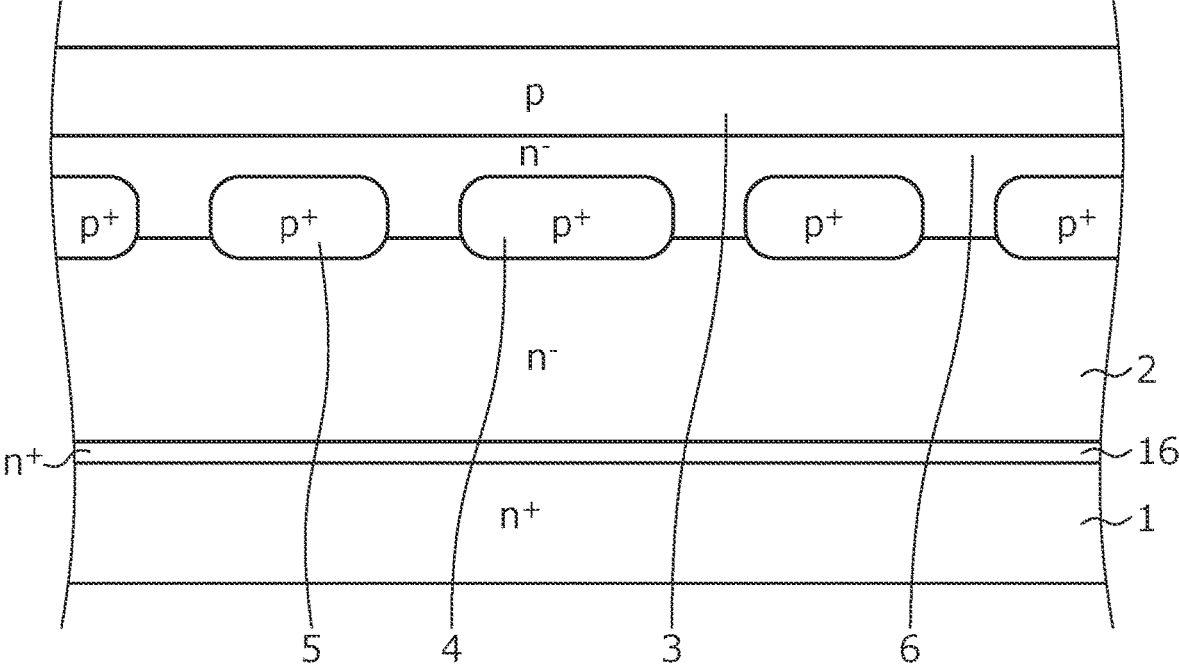
FIG. 6 is a cross-sectional view schematically depicting a state during manufacture of the silicon carbide semiconductor device according to the embodiment.

Next, on the surface of the first $n^-$-type silicon carbide epitaxial layer 2, a non-depicted resist mask having predetermined openings is formed by a photolithographic technique. Subsequently, as depicted in FIG. 6, the p-type base layer (second semiconductor layer of the second conductivity type) 3 having a thickness of about 0.5 $\mu$m is formed by ion implantation and has an impurity concentration of, for example, $3\times10^{17}$/cm$^3$ (step S4: fourth process). Next, the resist mask for the ion implantation is removed.

Figure 7:
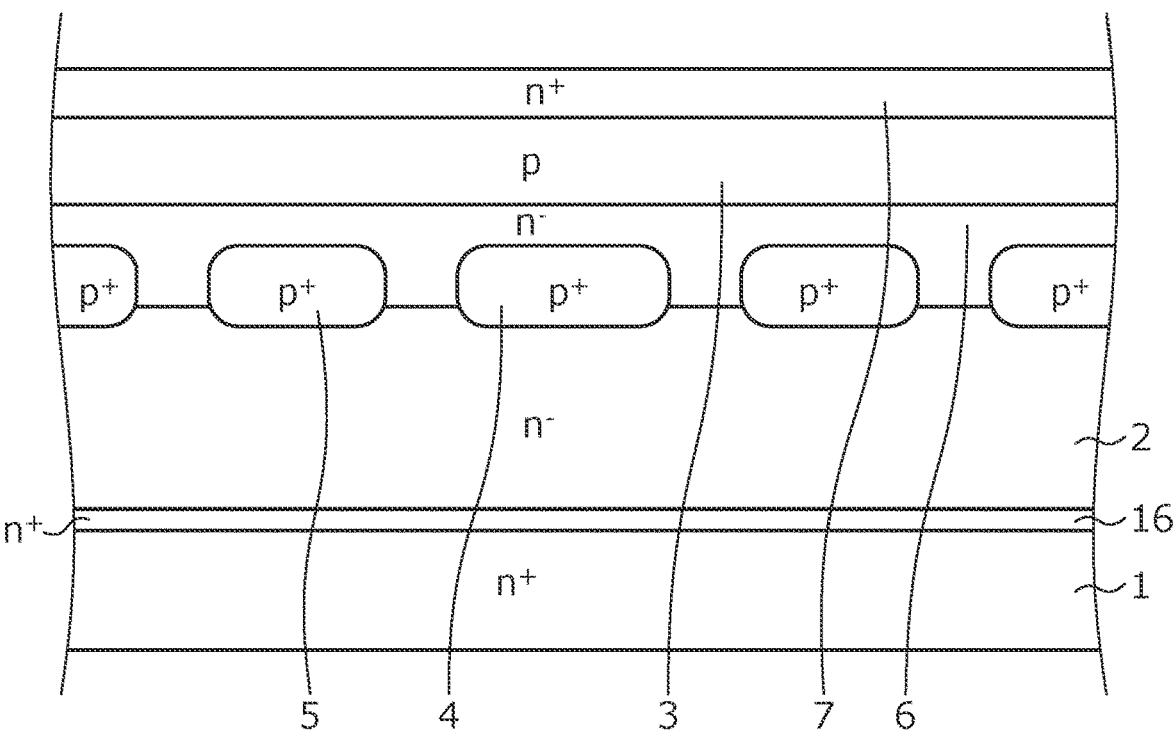
FIG. 7 is a cross-sectional view schematically depicting a state during manufacture of the silicon carbide semiconductor device according to the embodiment.

Next, on the surface of the p-type base layer 3, a non-depicted resist mask having predetermined openings is formed by a photolithographic technique. Subsequently, as depicted in FIG. 7, an $n^+$-type source layer (third semiconductor layer of the first conductivity type) 7 having a thickness of about 0.5 $\mu$m is formed by ion implantation and has an impurity concentration of, for example, $1\times10^{19}$/cm$^3$ (step S5: fifth process). Next, the resist mask for the ion implantation is removed.

Figure 8:
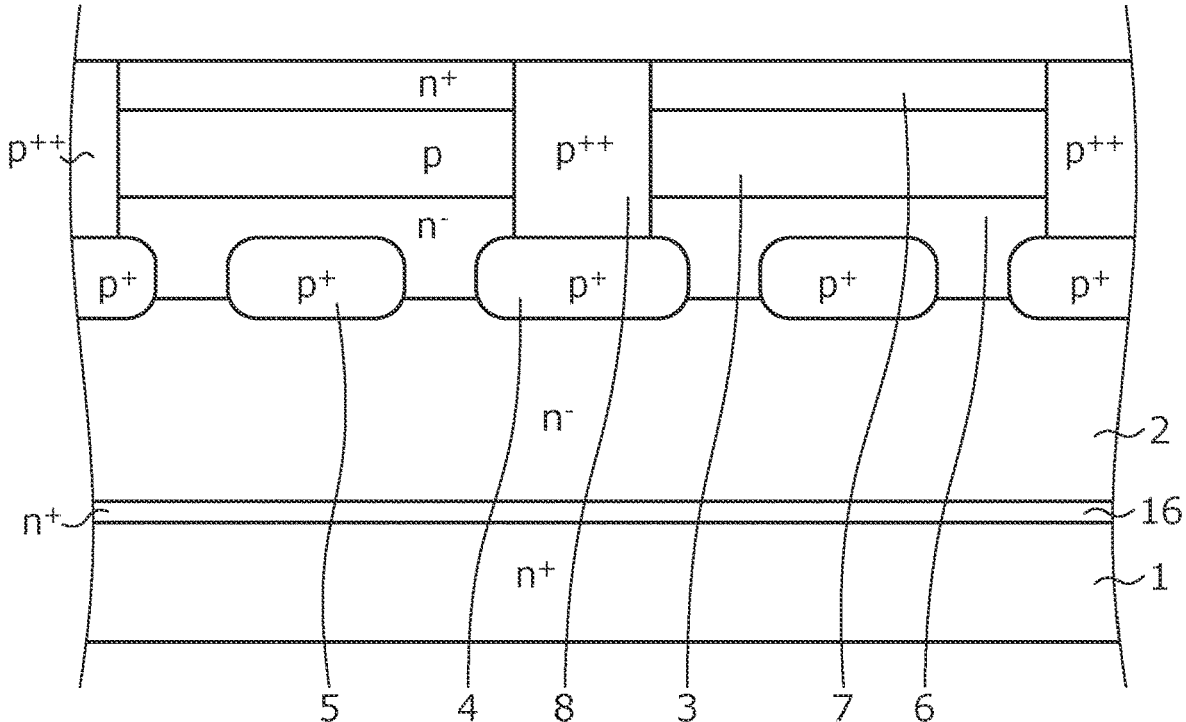
FIG. 8 is a cross-sectional view schematically depicting a state during manufacture of the silicon carbide semiconductor device according to the embodiment.

Next, an ion implantation mask having predetermined openings is formed, a p-type impurity such as aluminum is ion-implanted into portions of the $n^+$-type source layer 7 and portions of the p-type base layer 3, thereby forming, as depicted in FIG. 8, the $p^{++}$-type contact regions 8 having, for example, an impurity concentration of $1\times10^{20}$/cm$^3$ (step S6). Next, the resist mask for the ion implantation is removed.

Next, a second warpage reversal process for reversing warpage of the silicon carbide semiconductor substrate 30 is performed (step S7). Since ions are implanted only at the front side by ion implantation, warpage in a convex chevron-shape of, for example, about 120 $\mu$m is generated at the front surface of the silicon carbide semiconductor substrate 30. Thus, in the embodiment, in the second warpage reversal process, the silicon carbide semiconductor substrate 30 is oxidized so that the difference in the thicknesses of the oxide film (fourth oxide film) at the Si-face and the oxide film (third oxide film) at the C-face is in a range of 200 nm to 1000 nm and the amount of warpage of the silicon carbide semiconductor substrate 30 is reduced to less than 100 $\mu$m. As explained above, the thickness of the fourth oxide film at the Si-face becomes greater than that of the third oxide film at the C-face. For example, when the difference in the thicknesses of the oxide films is about 300 nm, according to FIG. 10, concave-shaped warpage of about 30 $\mu$m is generated at the front surface. Thus, the convex chevron-shaped warpage of 120 $\mu$m at the front surface formed by the ion implantation is reduced to 90 $\mu$m (120-30) and the amount of warpage of the silicon carbide semiconductor substrate 30 becomes less than 100 $\mu$m. Further, the oxide film formed here is removed before the subsequent activation treatment is implemented.

When the amount of warpage of the silicon carbide semiconductor substrate 30 caused by the ion implantation will not affect the next or subsequent processes, the second warpage reversal process at step S7 may be omitted. Nonetheless, while ion implantation of normal acceleration is performed to the second $n^-$-type silicon carbide layer 6, the p-type base layer 3, the $n^+$-type source layer 7, and the $p^{++}$-type contact regions 8, warpage is generated at each process and thus, preferably, the second warpage reversal process may be performed.

In the embodiment, after the first $p^+$-type regions 4 and the second $p^+$-type regions 5 are formed, the first warpage reversal process is performed and after the $p^{++}$-type contact regions 8 are formed, the second warpage reversal process is performed, nonetheless, the warpage reversal process may performed for each ion implantation. Further, when the amount of warpage of the silicon carbide semiconductor substrate 30 caused by the ion implantation will not affect the next or subsequent processes, the warpage reversal process may be omitted.

Next, a heat treatment is performed under an inert gas atmosphere of about 1750 degrees C., thereby implementing an activation treatment of doped regions formed by ion implantation (step S8: sixth process). The doped regions may be activated collectively by a single session of the heat treatment or may be activated by performing the heat treatment each time ion implantation is performed. Further, the sequence of step S8 and step S9 may be reversed. In other words, after forming the trenches 18, the activation treatment may be implemented. In this instance, a mask used to form the trenches 18 is formed on the oxide film formed by the second warpage reversal process and is removed together with the oxide film.

Figure 9:
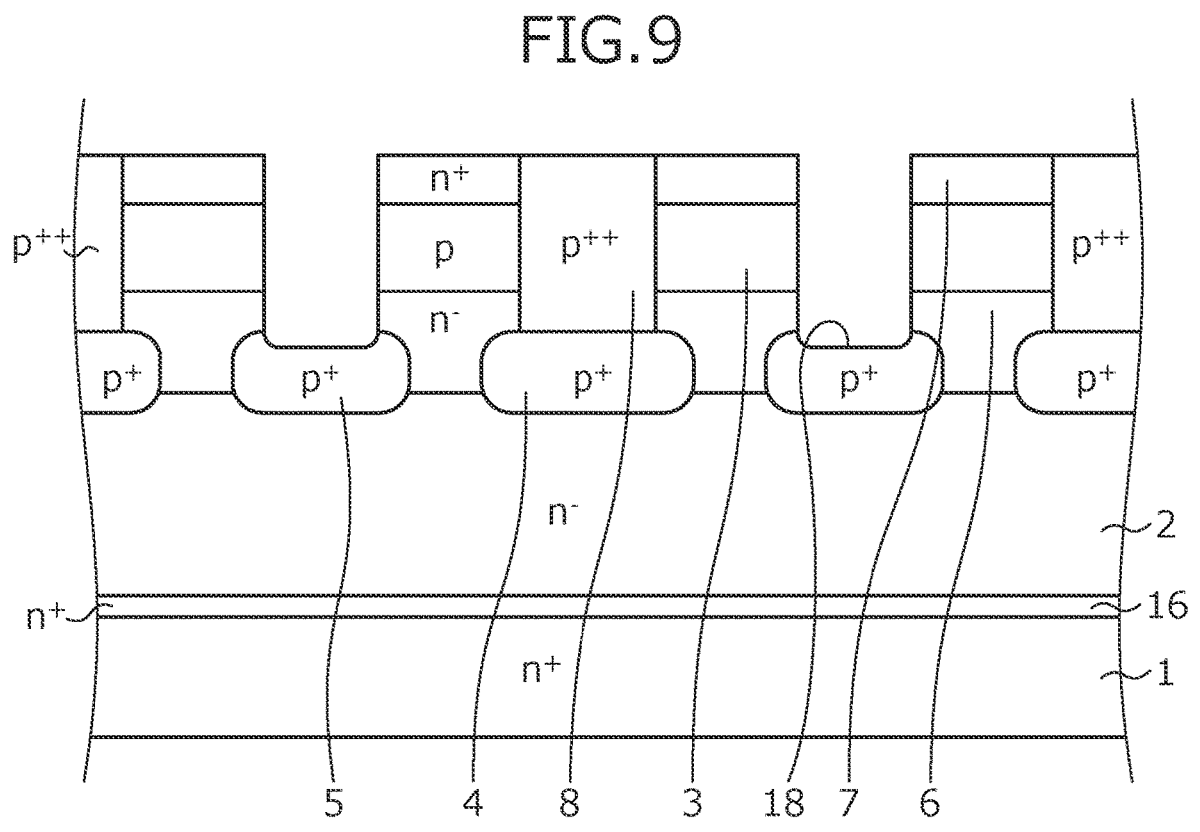

Next, on the surfaces of the $n^+$-type source regions 7, the mask used to form the trenches 18 and having predetermined openings is formed by photolithography using, for example, an oxide film. Next, as depicted in FIG. 9, the trenches 18, which penetrate through the $n^+$-type source regions 7 and the p-type base layer 3 and reach the second $p^+$-type regions 5 are formed by dry etching (step S9: seventh process). Next, the mask used to form the trenches 18 is removed.

As for the formation of the trenches 18, it is preferable for the amount of warpage of the silicon carbide semiconductor substrate 30 to be small and the front surface of the silicon carbide semiconductor substrate 30 to be flat and thus, the second warpage reversal process is performed before the trenches 18 are formed. Warpage of the silicon carbide semiconductor substrate 30 is eliminated by the activation treatment and thus, preferably, the activation treatment may be performed before the trenches 18 are formed.

Next, along the surfaces of the $n^+$-type source regions 7 and the $p^{++}$-type contact regions 8 and the bottoms and the sidewalls of the trenches 18, the gate insulating films 9 are formed. The gate insulating films 9 may be formed by thermal oxidation of a temperature of about 1300 degrees C. performed under a gas atmosphere containing oxygen. Further, the gate insulating films 9 may be formed by a deposition method by a chemical reaction such as that for a high temperature oxide (HTO), etc.

Next, on the gate insulating films 9, a polycrystalline silicon layer doped with, for example, phosphorus atoms is formed. The polycrystalline silicon layer may be formed so as to be embedded in the trenches 18. The polycrystalline silicon layer is patterned by photolithography and left in the trenches 18, thereby forming the gate electrodes 10 (eighth process).

Next, an insulating film is formed on the surfaces of the gate electrodes 10. For example, a thermal oxide film is formed by annealing under an oxygen atmosphere of a temperature of 1000 degrees C. Next, the surface is protected by a protective film formed by, for example, a photoresist. Next, the insulating film, gate electrodes, and gate insulating films formed at the back surface are completely removed by dry etching. Next, by an ash peeling process, the protective film formed on the surface is removed. Here, ashing in oxygen plasma and peeling with SPM were performed.

Next, for example, a phosphate glass of a thickness of about 1 μm is deposited so as to cover the gate insulating films 9 and the gate electrodes 10, thereby forming the insulating film 11. Next, the insulating film 11 and the gate insulating films 9 are patterned by photolithography, thereby forming contact holes exposing the $n^+$-type source regions 7 and the $p^{++}$-type contact regions 8. Next, in the contact holes and on the insulating film 11, a conductive film constituting the source electrodes (first electrodes) 13 is formed by, for example, depositing nickel by, for example, sputtering (the ninth process). Next, a heat treatment of about 700 degrees C. is performed, thereby selectively causing the conductive film and the silicon carbide to react and thereafter unreacted portions of the conductive film are selectively removed, leaving the conductive film only in the contact holes as the source electrodes 13 and causing the $n^+$-type source regions 7 and the $p^{++}$-type contact regions 8 to be in contact with the source electrodes 13.

Next, for example, by sputtering, on the source electrodes 13 and the insulating film 11 at the front surface of the silicon carbide semiconductor substrate, a metal film constituting the source electrode pad 15 is deposited by, for example, sputtering. At this time, a barrier metal (not depicted) containing titanium or titanium nitride may be formed first. A thickness of a portion of the electrode pad on the insulating film 11 may be, for example, 5.5 μm. The electrode pad may be formed of, for example, aluminum containing 1% silicon (Al—Si). Next, the metal film is selectively removed, thereby forming the source electrode pad 15.

Next, the front surface of the $n^+$-type starting substrate 1 may be covered and protected by a protective film (not depicted) and thereafter, the $n^+$-type starting substrate 1 may be ground from the back surface thereof, whereby the thickness of the $n^+$-type starting substrate 1 may be reduced to a product thickness.

Next, on the second main surface of the $n^+$-type starting substrate 1, a conductive film constituting the drain electrode (not depicted) is formed by, for example, successively depositing a molybdenum film and a nickel film by, for example, sputtering. Thereafter, for example, a heat treatment such as laser annealing is performed, thereby causing the $n^+$-type starting substrate 1 and the conductive film to react and form an ohmic junction, whereby the drain electrode is formed.

Next, on the surface of the drain electrode, for example, titanium, nickel, and gold are sequentially deposited as the drain electrode pad (second electrode) 14 (tenth process). As described, the silicon carbide semiconductor device depicted in FIG. 1 is completed.

As described, according to the embodiment, oxide films having different thicknesses are formed, respectively, at the C-plane and the Si-plane of the silicon carbide semiconductor substrate by oxidation. As a result, warpage of the silicon carbide semiconductor substrate generated by ion implantation is reduced and the amount of warpage of the silicon carbide semiconductor substrate may be reduced to less than 100 μm. Thus, patterning defects, stage chuck failures and conveyance failures inside the manufacturing equipment may be reduced or suppressed.

In the foregoing, the present invention may be variously modified within a range not departing from the spirit of the invention and in the described embodiments, for example, dimensions, impurity concentrations, etc. of regions and the like may be set according to necessary specifications. Further, in the embodiments, while the first conductivity type is assumed to be an n-type and the second conductivity type is assumed to be a p-type, the present invention is similarly implemented when the first conductivity type is a p-type and the second conductivity type is an n-type.

The method of manufacturing the silicon carbide semiconductor device according to the present invention achieves an effect in that warpage of the silicon carbide semiconductor substrate may be reduced or mitigated; and the occurrence of patterning defects, stage chuck failures and conveyance failures inside the manufacturing equipment may be reduced or suppressed.

As described, the method of manufacturing the silicon carbide semiconductor device according to the present invention is useful for power semiconductor devices used in power converting equipment such as that of inverters, power source devices such as those of various types of industrial machines, igniters of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method comprising:

preparing a silicon carbide semiconductor substrate in which a first semiconductor layer of a first conductivity type is provided on a first surface of a starting substrate of the first conductivity type, the first surface of the starting substrate being opposite to a second surface of the starting substrate, the first semiconductor layer having an impurity concentration lower than an impurity concentration of the starting substrate;

forming a plurality of first semiconductor regions of a second conductivity type in the first semiconductor layer by ion implantation;

performing a first treatment of reversing warpage of the silicon carbide semiconductor substrate after forming the plurality of first semiconductor regions;

forming a second semiconductor layer of the second conductivity type in the first semiconductor layer by ion implantation;

forming a third semiconductor layer of the first conductivity type in a surface layer of the second semiconductor layer by ion implantation;

activating the plurality of first semiconductor regions, the second semiconductor layer, and the third semiconductor layer;

forming a plurality of trenches penetrating through the third semiconductor layer and the second semiconductor layer and reaching the first semiconductor layer, each of the plurality of trenches being formed at a position facing a corresponding one of the plurality of first semiconductor regions in a depth direction of the device;

forming a plurality of gate electrodes in the plurality of trenches via a plurality of gate insulating films;

12 forming a first electrode in contact with the third semiconductor layer and the second semiconductor layer; and forming a second electrode at the second surface of the starting substrate, wherein the first treatment of reversing the warpage includes forming, at a C-face of the silicon carbide semiconductor substrate, a first oxide film that is thicker than a second oxide film formed at a Si-face of the silicon carbide semiconductor substrate.

2. The method according to claim 1, further comprising after the forming the third semiconductor layer but before the forming the plurality of trenches, performing a second treatment of reversing warpage of the silicon carbide semiconductor substrate, the second treatment of reversing the warpage including forming, at the C-face of the silicon carbide semiconductor substrate, a third oxide film that is thicker than a fourth oxide film formed at the Si-face of the silicon carbide semiconductor substrate.

3. The method according to claim 1, wherein the forming the plurality of first semiconductor regions includes further forming a plurality of second semiconductor regions of the second conductivity type in the first semiconductor layer by ion implantation, at positions between respective adjacent pairs of the plurality of trenches.

4. The method according to claim 1, wherein a difference in thicknesses of the first and second oxide films is in a range of 200 nm to 1000 nm.

5. The method according to claim 1, wherein the first treatment of reversing the warpage is performed until the warpage of the silicon carbide semiconductor substrate is reduced to less than 100 μm.

6. The method according to claim 1, wherein the first treatment of reversing the warpage is performed after each time the ion implantation is performed.

* * * * *